United States Patent
Lee et al.

(10) Patent No.: US 8,053,259 B2
(45) Date of Patent: *Nov. 8, 2011

(54) MANUFACTURING METHOD OF LIGHT EMITTING DIODE

(75) Inventors: Sang Min Lee, Siheung-si (KR); Hyuck Jung Choi, Seoul (KR); Won Il Kim, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/718,465

(22) Filed: Mar. 5, 2010

(65) Prior Publication Data

US 2010/0159620 A1 Jun. 24, 2010

Related U.S. Application Data

(63) Continuation of application No. 12/064,950, filed as application No. PCT/KR2006/003227 on Aug. 17, 2006, now Pat. No. 7,704,761.

(30) Foreign Application Priority Data

Aug. 26, 2005 (KR) ......................... 10-2005-0078784

(51) Int. Cl.
*H01L 21/00* (2006.01)
(52) U.S. Cl. ................... 438/25; 438/113; 257/E21.499
(58) Field of Classification Search .................... 438/25; 257/E21.352
See application file for complete search history.

(56) References Cited

U.S. PATENT DOCUMENTS

| 3,650,648 A | 3/1972 | Lambrecht |
| 5,484,274 A | 1/1996 | Neu |
| 6,608,334 B1 | 8/2003 | Ishinaga |

(Continued)

FOREIGN PATENT DOCUMENTS

DE 42 04 285 8/1993

(Continued)

OTHER PUBLICATIONS

Notice of Allowance issued on Dec. 24, 2009 in co-pending U.S. Appl. No. 12/064,950.

(Continued)

*Primary Examiner* — Chandra Chaudhari
(74) *Attorney, Agent, or Firm* — H.C. Park & Associates, PLC

(57) ABSTRACT

Disclosed is a manufacturing method of a light emitting diode. The manufacturing method comprises the steps of preparing a substrate and mounting light emitting chips on the substrate. An intermediate plate is positioned on the substrate. The intermediate plate has through-holes for receiving the light emitting chips and grooves for connecting the through-holes to one another on its upper surface. A transfer molding process is performed with a transparent molding material by using the grooves as runners to form first molding portions filling the through-holes. Thereafter, the intermediate plate is removed, and the substrate is separated into individual light emitting diodes. Accordingly, it is possible to provide a light emitting diode in which the first molding portion formed through a transfer molding process is positioned within a region encompassed by cut surfaces of the substrate. Since the first molding portion is positioned within the region encompassed by the cut surfaces of the substrate, second molding portions can be symmetrically formed on the side surfaces of the first molding portions in various manners.

11 Claims, 7 Drawing Sheets

U.S. PATENT DOCUMENTS

| | | |
|---|---|---|
| 6,682,331 B1 | 1/2004 | Peh et al. |
| 6,707,069 B2 * | 3/2004 | Song et al. ............... 257/79 |
| 6,822,326 B2 | 11/2004 | Enquist et al. |
| 7,291,529 B2 * | 11/2007 | Slater et al. ............... 438/200 |
| 2002/0015748 A1 | 2/2002 | Miyajima et al. |
| 2002/0185965 A1 | 12/2002 | Collins et al. |

FOREIGN PATENT DOCUMENTS

| | | |
|---|---|---|
| DE | 195 02 468 | 8/1996 |
| EP | 0 632 511 | 1/1995 |
| GB | 2 104 827 | 3/1983 |
| JP | 61-001067 | 1/1986 |
| JP | 62076747 | 4/1987 |
| JP | 63-013723 | 1/1988 |
| JP | 63-143824 | 6/1988 |
| JP | 04-111768 | 9/1992 |
| JP | 10-065219 | 3/1998 |
| JP | 2001-111115 | 4/2001 |
| JP | 2002-368286 | 12/2002 |
| JP | 2003-031854 | 1/2003 |
| JP | 2003-218399 | 7/2003 |
| JP | 2004-087973 | 3/2004 |
| JP | 2004-179644 | 6/2004 |
| JP | 2005-223216 | 8/2005 |

OTHER PUBLICATIONS

Extended European Search Report issued Apr. 19, 2010 by the European Patent Office in European Patent Application No. 06783634.6.

* cited by examiner

MANUFACTURING METHOD OF LIGHT EMITTING DIODE

CROSS-REFERENCE TO RELATED APPLICATIONS

This application is a continuation of U.S. patent application Ser. No. 12/064,950, filed on Feb. 26, 2008, which is the National Stage of International Application No. PCT/KR2006/003227, filed on Aug. 17, 2006, and claims priority from and the benefit of Korean Patent Application No. 10-2005-0078784, filed on Aug. 26, 2005, which are all hereby incorporated by reference for all purposes as if fully set forth herein.

FIELD OF THE INVENTION

The present invention relates to a manufacturing method of a light emitting diode (LED), and more particularly, to an improved manufacturing method of a light emitting diode, which can be used appropriately as a light source of a backlight, over a conventional manufacturing method of a light emitting diode.

BACKGROUND OF THE INVENTION

In order to manufacture a light emitting diode for a light source of a backlight, a method has been used in which a light emitting chip is mounted on a printed circuit board or a lead frame and then a molding portion for enveloping the light emitting chip is formed by a transfer molding process. FIGS. 1 to 3 are views illustrating such a conventional manufacturing method of a chip-type light emitting diode, wherein FIGS. 1(a) and 2(a) are plan views, FIGS. 1(b) and 2(b) are sectional views, and FIG. 3 is a perspective view showing the conventional chip-type light emitting diode.

Referring to FIG. 1, light emitting chips 12 are mounted on a substrate 11 such as a printed circuit board or a lead frame. The substrate 11 has lead electrodes (not shown), and the light emitting chips are electrically connected to the lead electrodes via wires 13.

Referring to FIG. 2, the substrate 11 on which the light emitting chips 12 are mounted is positioned within a mold die (not shown), and molding portions 14 are then formed by the transfer molding process. Conventionally, the mold die has runners through which a molding material can flow, and the light emitting chips are positioned within the runners. Accordingly, the molding portions 14 are formed along the rows of the light emitting chips as shown in the figure. Then, the substrate 11 is separated through a sawing process to obtain individual light emitting diodes as shown in FIG. 3.

According to the prior art, there are advantages in that the chip-type light emitting diodes can be mass-produced by forming the molding portions using the transfer molding process, and materials with large specific gravity such as inorganic phosphors can be uniformly dispersed in the molding portions 14 due to shorter molding time.

However, since the molding portions 14 for enveloping the light emitting chips 12 are transparent, light emitted from the light emitting chips 12 is emitted outwards through entire surfaces of the molding portions 14. Accordingly, there are disadvantages in that a range of directional angles of light is broader to cause reduction in light emission intensity within a desired range of directional angles, and light which is not used for backlighting increases, which results in a higher loss of light. Further, since cut surfaces at both sides of the substrate are coextensive with those of the molding portions as shown in FIG. 3, there is a disadvantage in that second molding portions cannot be formed on the cut surfaces of the molding portions 14.

Meanwhile, in order to improve the light emission intensity within a desired range of directional angles, a manufacturing method of a reflector-type light emitting diode has been used in which reflectors are attached to a substrate or formed by injection-molding an opaque synthetic resin, light emitting chips are mounted thereon, and then transparent molding portions are formed inside the reflectors.

The manufacturing method of such a reflector-type light emitting diode has an advantage in that light emission intensity within a desired range of directional angles can be improved. However, since it is difficult to form the transparent molding portions through a transfer molding process, a process of potting a liquid phase resin inside the reflectors has been generally used. Since the liquid phase resin should be separately potted inside the respective reflectors in the process of potting the liquid phase resin, productivity is lowered. Further, since it takes a great deal of time to perform the molding process so that phosphors with large specific gravity go down, it is difficult to provide molding portions with the phosphors dispersed uniformly therein. Moreover, the technique of attaching the reflectors or forming the reflectors using injection molding has a limitation on reduction in the thickness of each of light emitting diodes.

An object of the present invention is to provide a manufacturing method of a light emitting diode in which a first molding portion formed by a transfer molding process is positioned within a region encompassed by cut surfaces of a substrate.

Another object of the present invention is to provide a manufacturing method of a light emitting diode, which has a symmetrical, second molding portion formed on side surfaces of the first molding portion.

A further object of the present invention is to provide a manufacturing method of a light emitting diode capable of improving light emission intensity within a desired range of directional angles.

A still further object of the present invention is to provide a manufacturing method of a light emitting diode that has a reflector, the method being able to prevent the thickness of the light emitting diode from being increased.

To solve the technical problems, a manufacturing method of a light emitting diode according to an aspect of the present invention comprises the step of preparing a substrate. Light emitting chips are mounted on the substrate, and an intermediate plate is positioned on the substrate. The intermediate plate has through-holes for receiving the light emitting chips and grooves for connecting the through-holes to one another on an upper surface of the intermediate plate. Then, a transfer molding process is performed with a transparent molding material by using the grooves as runners so as to form first molding portions filling the through-holes. Thereafter, the intermediate plate is removed, and the substrate is separated into individual light emitting diodes. Accordingly, since the first molding portions are formed in the through-holes of the intermediate plate, it is possible to provide a light emitting diode in which the first molding portion is positioned within a region encompassed by cut surfaces of the substrate.

Meanwhile, the transparent molding material may contain phosphor powders. Accordingly, since the first molding portions are formed by performing the transfer molding process with the transparent molding material containing the phosphor powders, the phosphors can be prevented from going down in the first molding portions.

The intermediate plate may be positioned on the substrate before the light emitting chips are mounted. Thereafter, the light emitting chips may be mounted in the through-holes of the intermediate plate.

Meanwhile, in an embodiment of the present invention, after the intermediate plate is removed, second molding portions for surrounding at least side surfaces of the first molding portions may be formed.

In some embodiments of the present invention, the second molding portions may be formed by performing molding out of an opaque molding material to cover the first molding portions and by removing the opaque molding material until upper surfaces of the first molding portions are exposed. Alternatively, the second molding portions may be formed by performing molding out of an opaque molding material to fill spaces between the first molding portions while exposing the upper surfaces of the first molding portions. The second molding portions formed out of the opaque molding material may serve as reflectors to improve light emission intensity within a desired range of directional angles. Since the second molding portions are formed to be flush with the first molding portions, it is possible to prevent an increase in the thickness of the light emitting diode.

In some embodiments of the present invention, the second molding portions may be molded out of a transparent molding material to have lens portions for covering the respective upper surfaces of the first molding portions. The lens portion is used to focus light emitted from the light emitting chip within a range of directional angles, thereby improving light emission intensity.

Meanwhile, the second molding portions for surrounding at least side surfaces of the first molding portions may be formed to be spaced apart from one another. Further, the second molding portions may cover upper surfaces of the first molding portions and contain phosphors. Accordingly, it is possible to provide a light emitting diode in which the second molding portion containing the phosphors is uniformly formed on the first molding portion. The second molding portions may be formed by using another intermediate plate that has through-holes for receiving the first molding portions.

A manufacturing method of a light emitting diode according to another aspect of the present invention comprises the step of preparing a substrate. Light emitting chips are mounted on the substrate, and first transparent molding portions for covering the respective light emitting chips are formed. Then, second opaque molding portions for covering side surfaces of the first molding portions are formed, and the substrate is separated into individual light emitting diodes. Accordingly, it is possible to manufacture a light emitting diode in which an increase in the thickness thereof can be prevented and light emission intensity within a desired range of directional angles can be improved.

The second molding portions may be formed by performing molding out of an opaque molding material to cover the first molding portions, and by removing the opaque molding material until the upper surfaces of the first molding portions are exposed. Alternatively, the second molding portions may be formed by performing molding out of an opaque molding material to fill spaces between the first molding portions while exposing the upper surfaces of the first molding portions.

According to the present invention, it is possible to manufacture a light emitting diode in which a first molding portion formed through a transfer molding process is positioned within a range encompassed by cut surfaces of a substrate so that a second molding portion can be symmetrically formed on side surfaces of the first molding portion. Accordingly, the second molding portion may be formed to serve as a reflector or to have a lens portion, thereby improving light emission intensity within a desired range of directional angles. If the second molding portion with the function of the reflector is selected, it is possible to prevent an increase in the thickness of the light emitting diode contrary to a conventional chip-type light emitting diode, and to remarkably improve light emission intensity within a desired range of directional angles.

DESCRIPTION OF THE DRAWINGS

FIG. 3 is a perspective view showing the conventional chip-type light emitting diode.

DETAILED DESCRIPTION

Figure 1:
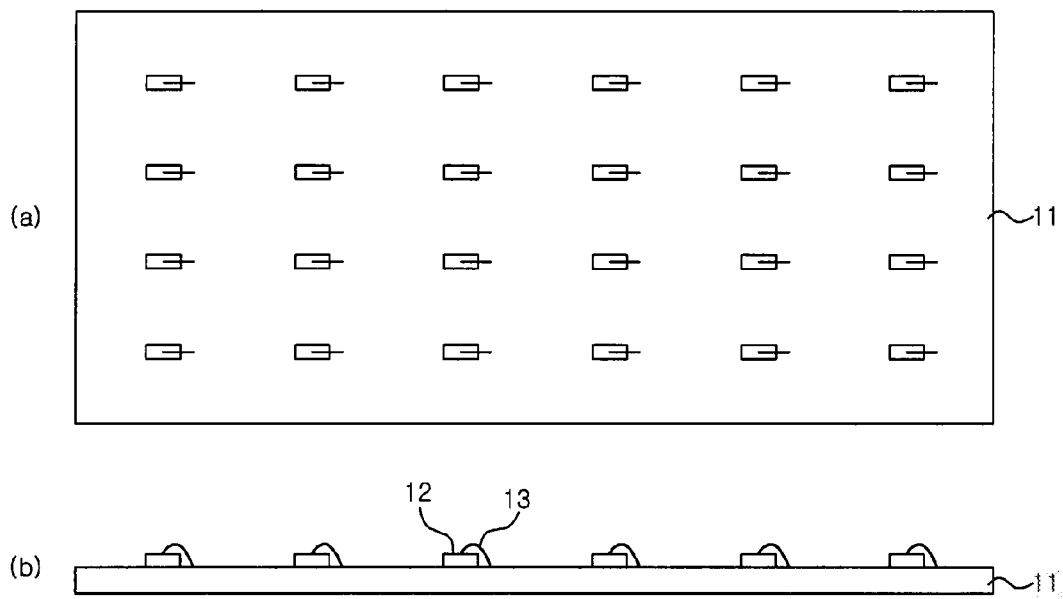
FIGS. 1 and 3 are views illustrating a conventional manufacturing method of a chip-type light emitting diode, wherein FIGS. 1($a$) and 2($a$) are plan views, FIGS. 1($b$) and 2($b$) are sectional views.
Figure 2:
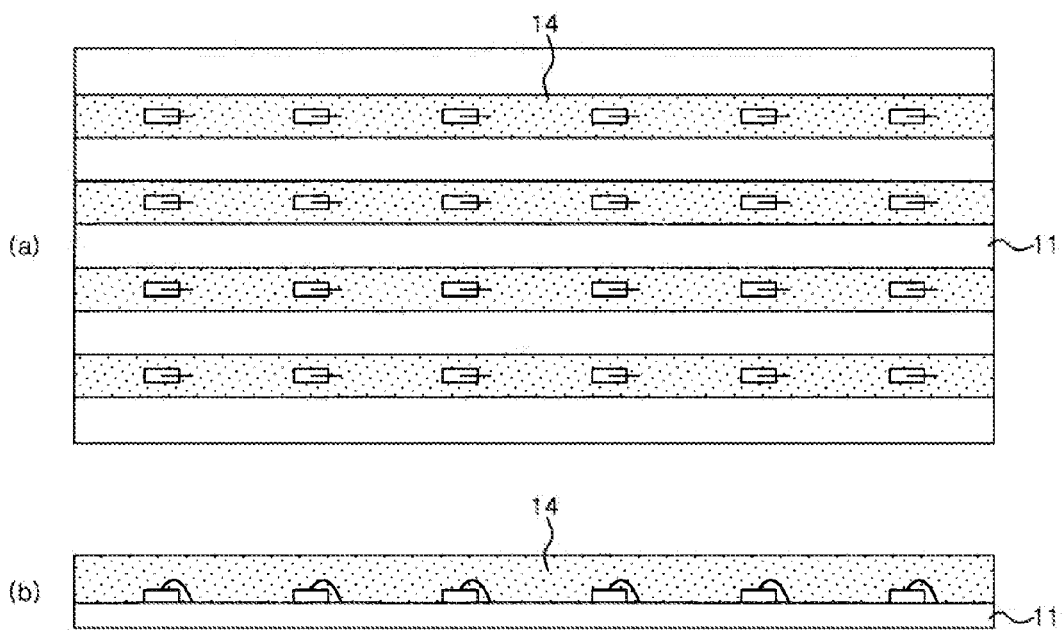
Figure 3:
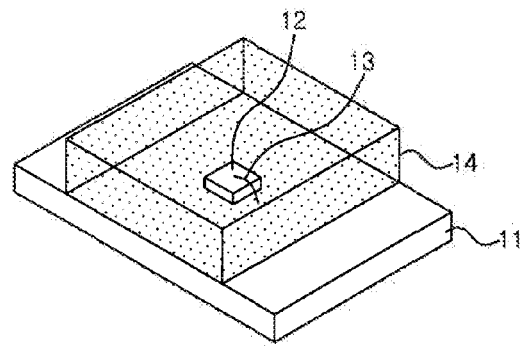

Hereinafter, embodiments of the present invention will be described in detail with reference to the accompanying drawings. The embodiments introduced below are provided only as examples for sufficient transfer of the sprit of the present invention to those skilled in the art. Accordingly, the present invention is not limited to the following embodiments but may be implemented in various different forms. The widths, lengths and thicknesses of components may be represented in an exaggerative manner for the sake of convenience in the drawings. Throughout the specification, like elements are designated by like reference numerals.

Figure 4:
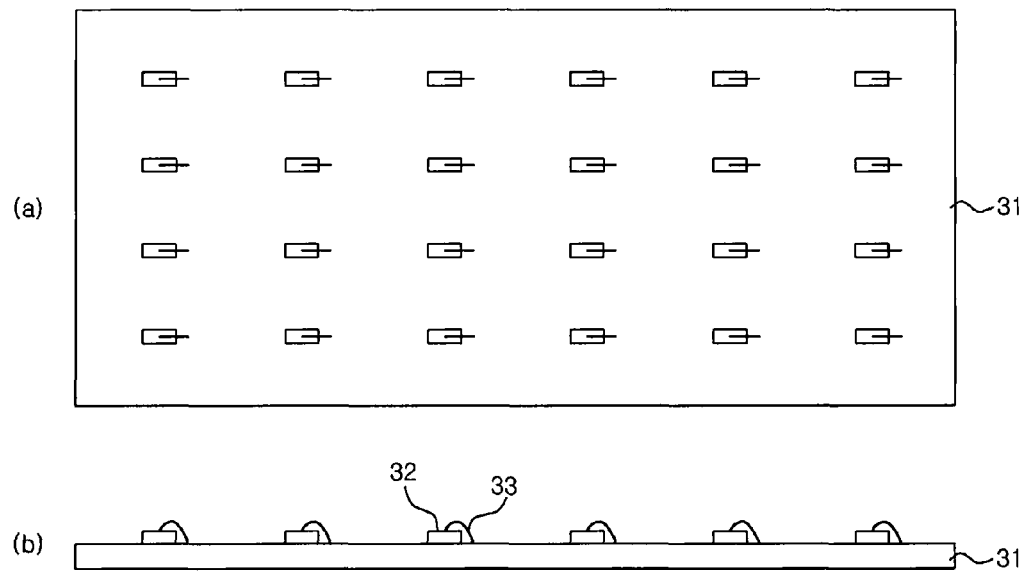
FIGS. 4 to 9 are views illustrating a manufacturing method of a light emitting diode according to an embodiment of the present invention, wherein FIGS. 4($a$), 5($a$), 7($a$) and 8($a$) are plan views while FIGS. 4($b$), 5($b$), 7($b$) and 8($b$) are sectional views.

FIGS. 4 to 9 are views illustrating a manufacturing method of a light emitting diode according to an embodiment of the present invention, wherein FIGS. 4($a$), 5($a$), 7($a$) and 8($a$) are plan views while FIGS. 4($b$), 5($b$), 7($b$) and 8($b$) are sectional views.

Referring to FIG. 4, light emitting chips 32 are mounted on a substrate 31 such as a printed circuit board or a lead frame. The light emitting chips 32 are typically arranged in a matrix form as shown in the figure. The substrate 31 has lead electrodes (not shown), and the light emitting chips 32 are electrically connected to the lead electrodes through wires 33, respectively. Each of the light emitting chips 32 may be a single bonding die in which each of the wires 33 is bonded to one of the electrodes, but it is not limited thereto. The light emitting chip 32 may be a double boning die in which the wires 33 are boned respectively to two electrodes, or a flip chip electrically connected to the lead electrodes of the substrate without using the wires 33.

Figure 5:
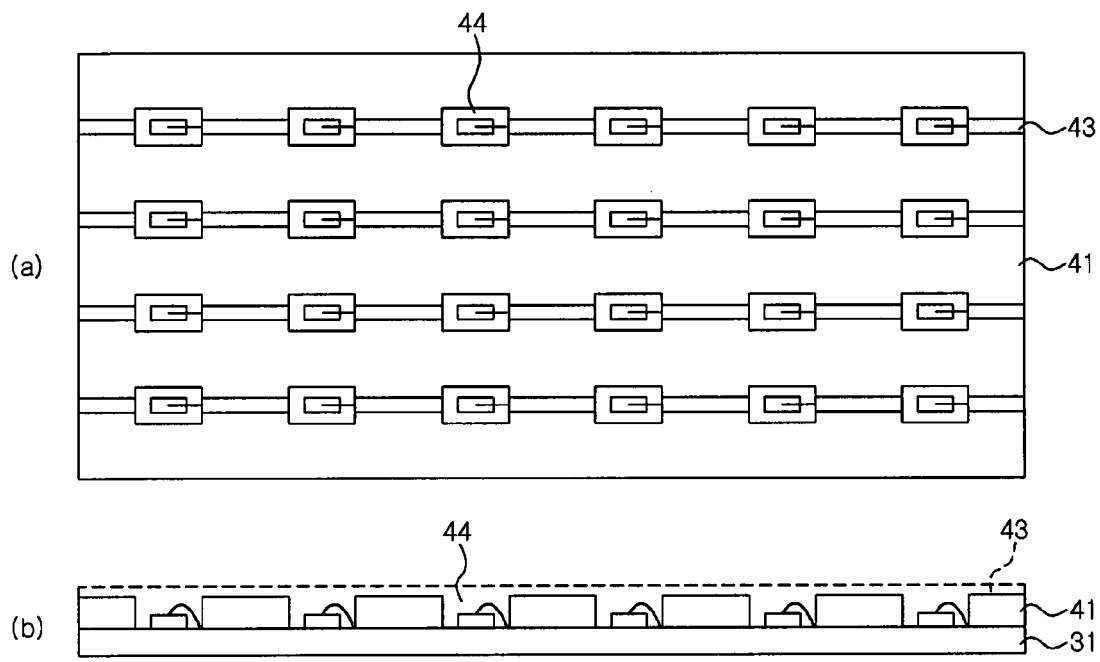

Referring to FIG. 5, an intermediate plate 41 is positioned on the substrate 31 on which the light emitting chips 32 are mounted. The intermediate plate 41 has through-holes 44 for respectively receiving the light emitting chips 32 therein and grooves 43 for respectively connecting the through-holes 44 to one another on an upper surface of the intermediate plate 41. Accordingly, the light emitting chips 32 are positioned in the through-holes of the intermediate plate 41, respectively.

The intermediate plate 41 has no limitation on its material so far as it is not deformed during a transfer molding process. Further, although the through-holes 44 are shown as being in the form of a rectangular post, they may take various forms such as truncated pyramids or cones according to their own purposes. Moreover, although the grooves 43 may connect the through-holes 44 to one another on a row basis as shown in the figures, they are not limited thereto but may make connections in various forms.

Although the light emitting chips 32 are mounted before the mounting of the intermediate plate 41 in this embodiment, the processing sequence may be changed. That is, after the intermediate plate 41 is positioned on the substrate 31, the light emitting chips 32 may be mounted in the through-holes 44.

Figure 6:
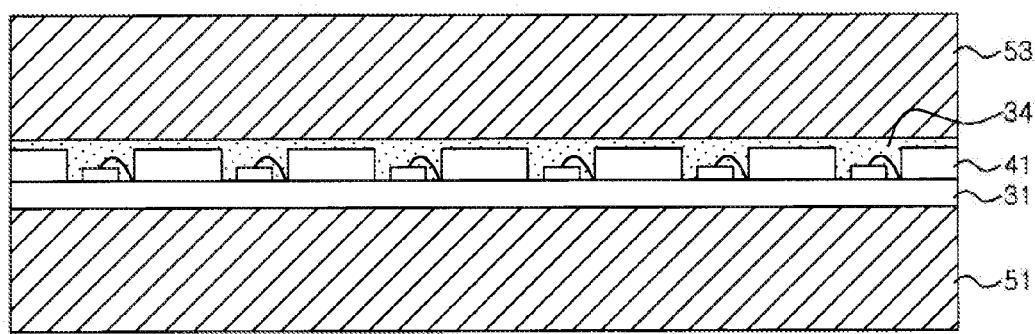

Referring to FIG. 6, the substrate 31 is positioned between lower and upper mold dies 51 and 53, and the grooves 43 of the intermediate plate 41 are used as runners to perform a transfer molding process with a transparent molding material, e.g., epoxy or silicone resin, thereby forming first molding portions 34.

Unlike a conventional manufacturing method of a light emitting diode, the upper mold die 53 may not have its runners so that a lower surface of the upper mold die 53 may be a flat surface. The transparent molding material flows on the intermediate plate 41 along the grooves 43 of the intermediate plate 41, thereby filling the through-holes 44. Thereafter, the transparent molding material is cured to form the first molding portions 34.

The transparent molding material may contain diffusing agents or phosphors. Since the first molding portions 34 are formed through the transfer molding process, it is possible to form the first molding portions 34 with the phosphors uniformly dispersed therein. The type of the phosphors may be appropriately selected to convert light of the light emitting chips 32 into light having a desired wavelength.

Figure 7:
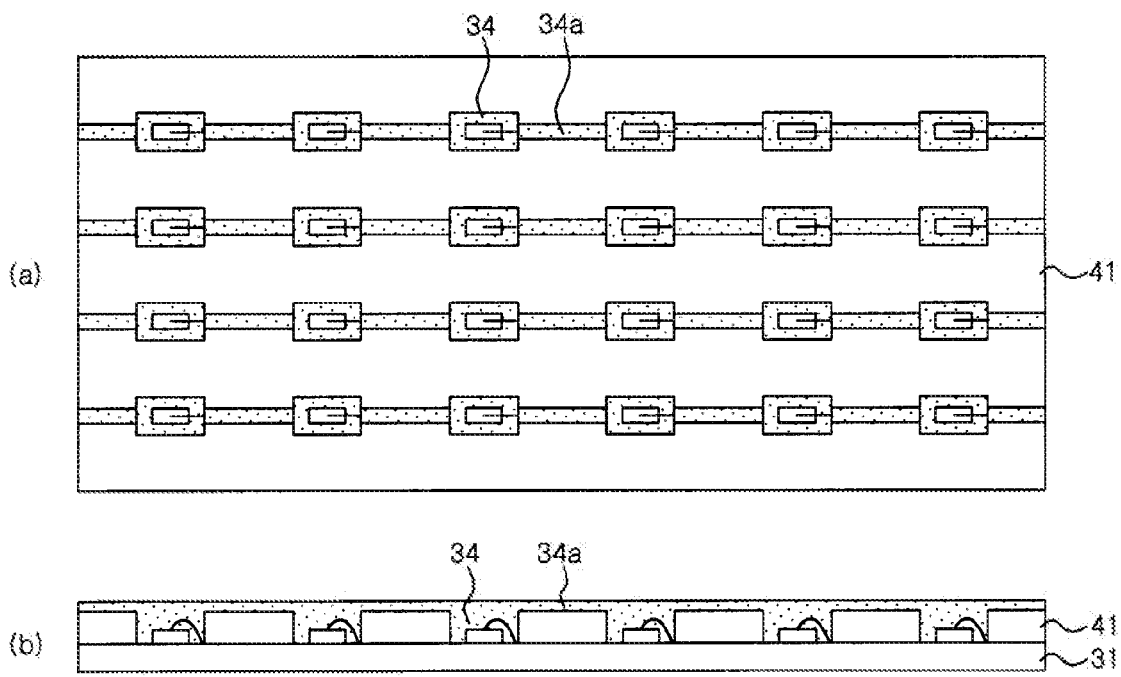

Referring to FIG. 7, there is shown a state where the substrate 31 is taken out from the lower and upper mold dies 51 and 53. The intermediate plate 41 is still positioned on the substrate 31, and the through-holes 44 of the intermediate plate 41 are filled with the first molding portions 34. Remaining molding portions 34a are also filled in the grooves 43 of the intermediate plate 41.

Figure 8:
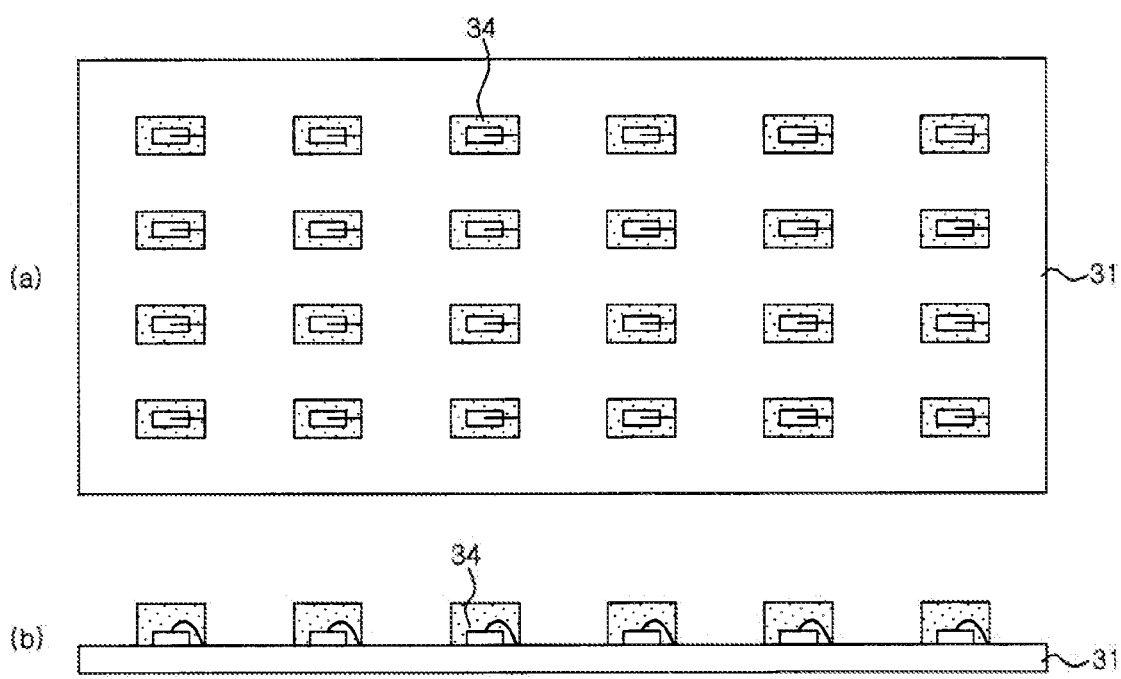

Referring to FIG. 8, the intermediate plate 41 is removed from the substrate 31. Accordingly, the molding portions 34a filled in the grooves 43 of the intermediate plate 41 are also removed together with the intermediate plate 41. Various means may be employed to separate the remaining molding portions 34a easily from the first molding portions 34 within the through-holes 44. For example, the widths or depths of the grooves 43 may be reduced at positions where the grooves 43 and the through-holes 44 are joined together, so that the remaining molding portions 34a may be easily separated from the first molding portions 34.

Figure 9:
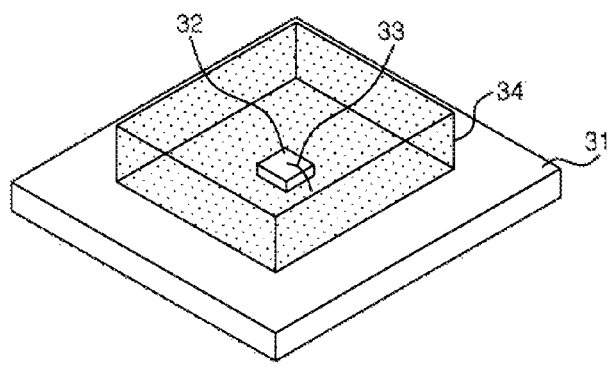

Referring to FIG. 9, the substrate 31 is subjected to a sawing process so that the substrate 31 can be separated into individual light emitting diodes. The sawing process may be performed using a blade or a laser. After the sawing process, cut surfaces are cleaned. As a result, as shown in the figure, chip-type light emitting diodes with the first molding portions 34 positioned within a region encompassed by the cut surfaces of the substrate 31 are obtained.

According to the present embodiment, since the intermediate plate 41 with the grooves 43 provided in the upper surface thereof is used, the molding portions 34a that have filled the grooves 43 used as runners are removed together with the intermediate plate 41. Accordingly, unlike the prior art, light emitting diodes in which the first molding portions 34 are positioned within a region encompassed by the cut surfaces of the substrate 31 are manufactured.

Figure 10:
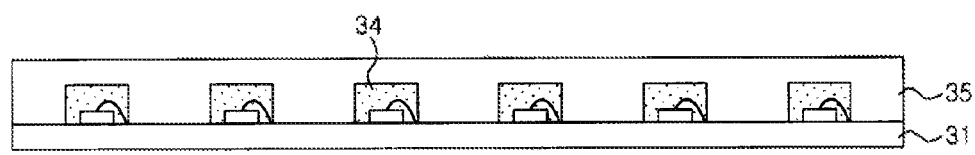
FIGS. 10 to 12 are views illustrating a manufacturing method of a light emitting diode according to another embodiment of the present invention, wherein FIG. 11($a$) is a plan view and FIG. 11($b$) is a sectional view.
Figure 11:
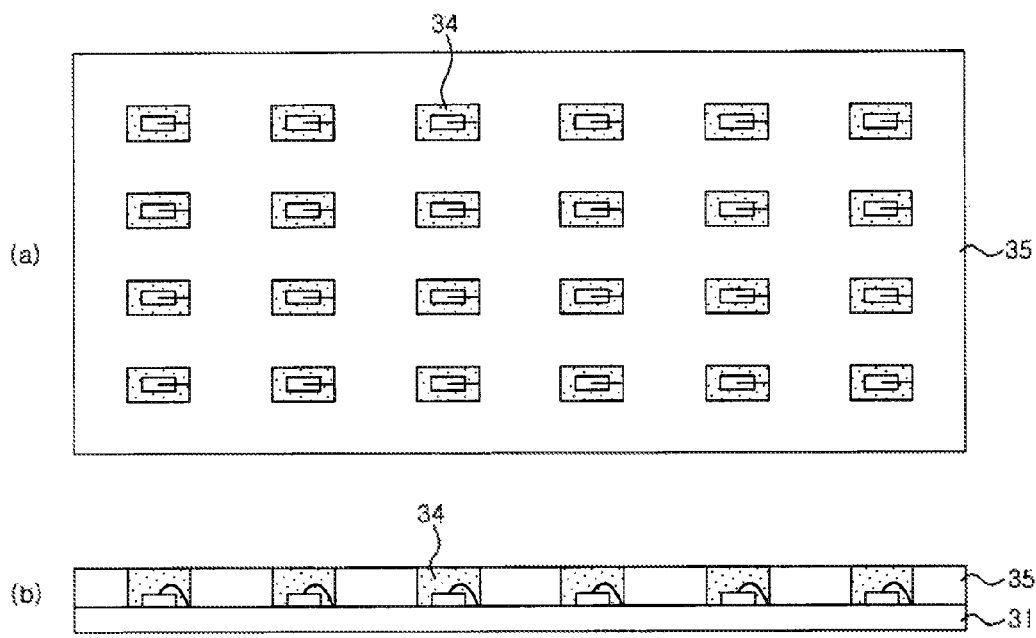
Figure 12:
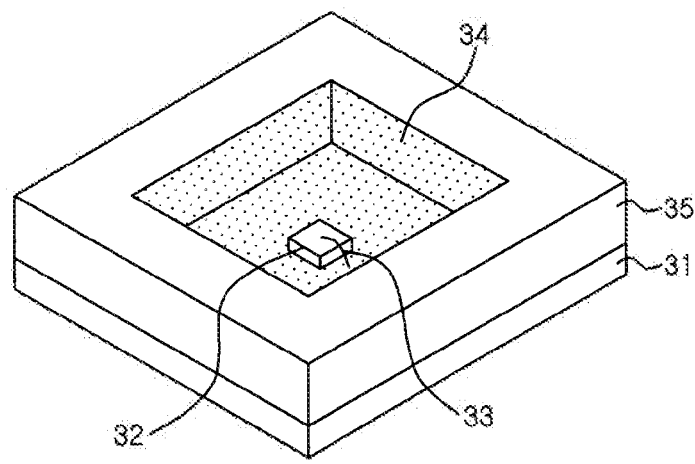

FIGS. 10 to 12 are views illustrating a manufacturing method of a light emitting diode according to another embodiment of the present invention, wherein FIG. 11(a) is a plan view while FIG. 11(b) is a sectional view, and FIGS. 10 and 12 are sectional and plan views, respectively.

Referring to FIG. 10, the intermediate plate 41 is used to form the first molding portions 34 for covering the light emitting chips 32 on the substrate 31, respectively, and is then removed, as described above with reference to FIGS. 4 to 8. Thereafter, an opaque molding material is applied to form second molding portions 35 for covering the substrate 31 on which the first molding portions 34 are formed. The opaque molding material fills spaces between the first molding portions 34 while covering the first molding portions 34.

An opaque heat-resistant resin such as PPA or a white epoxy resin with $TiO_2$ mixed therein may be used as the opaque molding material. The opaque molding material may be molded by means of various methods such as a screen-print process, a transfer molding process and an injection molding process, and cured by ultraviolet rays as well as heat.

Referring to FIG. 11, the opaque molding material is removed by means of a polishing process or the like until upper surfaces of the first molding portions 34 are exposed. As a result, the second molding portions 35 covers the side surfaces of the first molding portions 34 while exposing the upper surfaces of the first molding portions 34.

In the present embodiment, the first molding portions 34 are covered with the opaque molding material and the opaque molding material is partially removed, so that the second molding portions 35 are formed to cover the side surfaces of the first molding portions 34.

However, the opaque molding material may be applied not to cover the upper surfaces of the first molding portions 34 in other embodiments of the present invention. In this case, a process of partially removing the opaque molding material, e.g., the polishing process, may be eliminated. This method can be implemented, for example, by placing the substrate 31 within the mold dies so that the upper mold die can be brought into contact with the upper surfaces of the first molding portions 34, and forming the second molding portions 35 by means of the transfer molding process or the injection molding process.

Referring to FIG. 12, the sawing process is performed to separate the substrate with the second molding portions 35 formed thereon into individual light emitting diodes. Accordingly, a light emitting diode with the second molding portion 35, which is made of the opaque molding material and symmetrically surrounds the side surfaces of the first molding portion 34, is manufactured.

The second molding portions 35 can be used as conventional reflectors, so that light emission intensity within a desired range of directional angles can be improved. Further, since the second molding portions 35 have the same height as the first molding portions 34, the thickness of the light emitting diode is not increased even though the second molding portions 35 are employed.

Meanwhile, in a conventional light emitting diode employing a reflector, it is difficult to form a transparent molding portion by means of a transfer molding process due to the shape of the reflector and the material of the reflector which is vulnerable to high temperature. However, since the second molding portions 35 are formed after the formation of the first molding portions 34 in this embodiment, the first molding portions may be formed by means of the transfer molding process without being bound by the material and shape of the second molding portions.

Further, although the first molding portions 34 are formed by means of the transfer molding process using the intermediate plate 41 which has the through-holes 44 and the grooves 43 in this embodiment, the first molding portion 34 may be formed by means of various methods such as a conventional screen-print process and a conventional injection molding process other than the transfer molding process.

Meanwhile, the second molding portion 35 may have a predetermined inclined surface for reflecting light emitted from the light emitting chip 32 within a desired range of directional angles. In the present embodiment, the inclined surface of the second molding portion 35 is formed along the side surface of the first molding portion 34, and the side surface of the first molding portion 34 is determined by the shape of the through-hole 44 of the intermediate plate 41. Accordingly, the inclined surface of the second molding portion 35 can be controlled by properly adjusting the shape of the through-hole 44.

Figure 13:
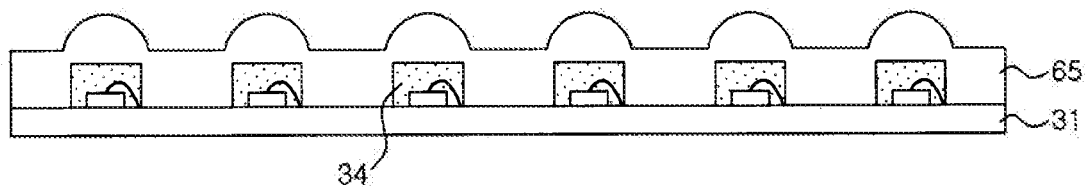
FIGS. 13 and 14 are sectional and perspective views illustrating a manufacturing method of a light emitting diode according to a further embodiment of the present invention.
Figure 14:
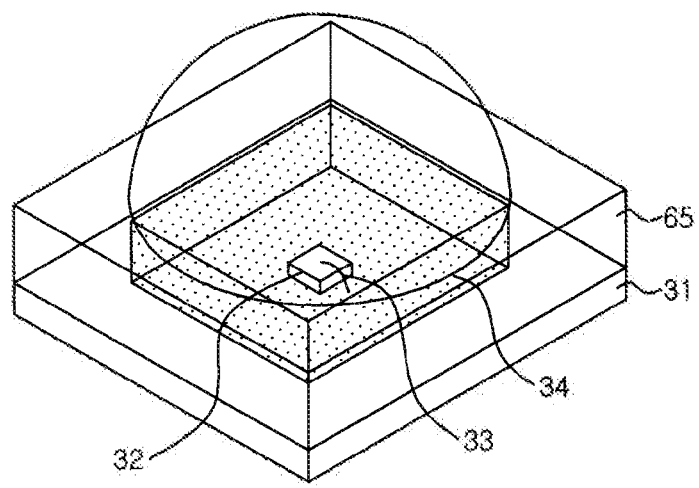

FIGS. 13 and 14 are sectional and perspective views illustrating a manufacturing method of a light emitting diode according to a further embodiment of the present invention, respectively.

Referring to FIG. 13, the intermediate plate 41 is used to form the first molding portions 34 covering the light emitting chips 32 on the substrate 31 and then removed, as described above with reference to FIGS. 4 to 8. Thereafter, the substrate 31 is positioned within mold dies having lens-shaped recesses at positions corresponding to those of the light emitting chips 32, and molding is performed with a transparent molding material to form second molding portions 65.

The second molding portions 65 may be formed through a transfer molding process or an injection molding process. As a result, the second molding portions 65 which cover the first molding portions and have lens portions thereon are formed as shown in FIG. 13.

Referring to FIG. 14, the substrate with the second molding portions 65 formed thereon is subjected to a sawing process so that it can be separated into individual light emitting diodes. Accordingly, a light emitting diode having the second molding portion 65, which symmetrically surrounds the side surfaces of the first molding portion 34 and covers the upper surface of the first molding portion 34 to define a lens shape, is manufactured. The lens portion of the second molding portion 65 causes light emitted from the light emitting chip 32 to be focused within a desired range of directional angles, thereby improving light emission intensity.

The second molding portion 65 may be formed of the same material as the first molding portion 34, e.g., epoxy or silicone resin.

Figure 15:
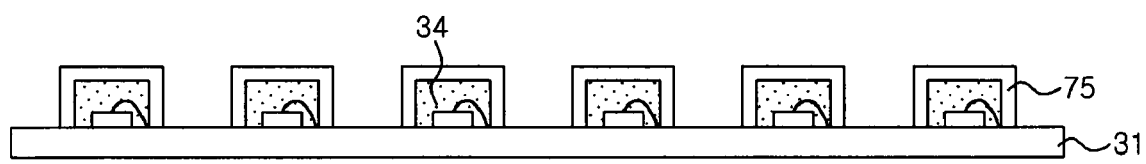
FIGS. 15 and 16 are sectional and perspective views illustrating a manufacturing method of a light emitting diode according to a still further embodiment of the present invention.
Figure 16:
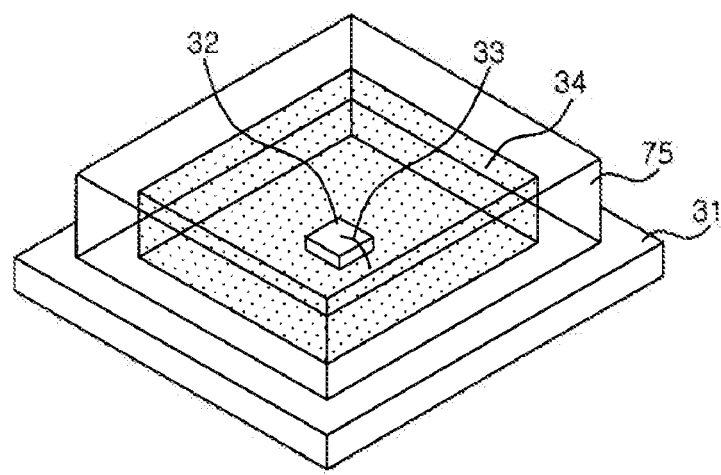

FIGS. 15 and 16 are sectional and perspective views illustrating a manufacturing method of a light emitting diode according to a still further embodiment of the present invention, respectively.

Referring to FIG. 15, the intermediate plate 41 is used to form the first molding portions 34 covering the light emitting chips 32 on the substrate 31 and then removed, as described above with reference to FIGS. 4 to 8. Thereafter, second molding portions 75 for respectively covering the first molding portions 34 are formed.

The second molding portions 75 may be formed through a transfer molding process or an injection molding process using an intermediate plate (not shown) having through-holes for receiving the first molding portions 34.

Although the intermediate plate may have through-holes and grooves, which have the same shapes as those of the intermediate plate 41 illustrated with reference to FIG. 5, the through-holes of the intermediate plate are larger than the through-holes 44 of the intermediate plate 41. However, since the grooves are not necessarily required according to a molding process, the intermediate plate may have only the through-holes for receiving the first molding portions 34.

The thickness of the second molding portions 75 can be controlled by adjusting the size of the through-holes of the intermediate plate, and the second molding portions 75 may be formed to cover the first molding portions 34 with a uniform thickness.

Referring to FIG. 16, the substrate with the second molding portions 75 formed thereon is subjected to a sawing process so that it can be separated into individual light emitting diodes. Accordingly, a light emitting diode having the second molding portion 75, which symmetrically surrounds the side surfaces of the first molding portion 34 and uniformly covers the upper surface of the first molding portion 34, is manufactured. The second molding portion 75 may be formed with a uniform thickness on the side surfaces and upper surface of the first molding portion 34.

In this embodiment, the first molding portion 34 or the second molding portion 75 may contain phosphors. Specifically, in a case where the phosphors are dispersed in the second molding portion 75, they cause the light emitted from the light emitting chip 32 to be subjected to uniform wavelength conversion. Further, the first molding portion 34 and the second molding portion 75 may contain respective phosphors. For example, the first molding portion 34 may contain red phosphors while the second molding portions 75 may contain green phosphors, thereby providing a white light emitting diode. In this case, light which has been subjected to wavelength conversion by the red phosphors of the first molding portion 34 is emitted outwards without being absorbed by the green phosphors of the second molding portion. Thus, it is possible to prevent loss of the light. On the contrary, the first molding portion 34 may contain green phosphors while the second molding portion 75 may contain red phosphors. In this case, light which has been subjected to wavelength conversion by the green phosphors is subjected again to wavelength conversion into red by the red phosphors, so that the light intensity of the red light can be increased.

What is claimed:
1. A manufacturing method of a light emitting diode, comprising the steps of:
   preparing a substrate;
   mounting light emitting chips on the substrate;
   positioning an intermediate plate on the substrate, the intermediate plate having through-holes for receiving the light emitting chips and grooves for connecting the through-holes to one another on its upper surface;
   performing a molding process with a transparent molding material using the grooves as runners to form first molding portions filling the through-holes;
   removing the intermediate plate; and
   performing separation into individual light emitting diodes.

2. The method as claimed in claim 1, wherein the transparent molding material contains phosphor powders.

3. The method as claimed in claim 1, wherein the step of positioning the intermediate plate is performed prior to the step of mounting the light emitting chips.

4. The method as claimed in claim 1, after the step of removing the intermediate plate, further comprising the step of forming second molding portions for surrounding at least side surfaces of the first molding portions.

5. The method as claimed in claim 4, wherein the step of forming the second molding portions comprises the steps of:
   performing molding out of an opaque molding material to cover the first molding portions; and
   removing the opaque molding material until upper surfaces of the first molding portions are exposed.

6. The method as claimed in claim 4, wherein the step of forming the second molding portions is performed by molding an opaque molding material to fill spaces between the first molding portions while exposing upper surfaces of the first molding portions.

7. The method as claimed in claim 4, wherein the second molding portions have lens portions, the lens portions being molded out of a transparent molding material and covering respective upper surfaces of the first molding portions.

8. The method as claimed in claim 5, wherein the first molding portions contain phosphors.

9. The method as claimed in claim 4, wherein the second molding portions are formed to be spaced apart from one another.

10. The method as claimed in claim 9, wherein the second molding portions cover respective upper surfaces of the first molding portions, and at least one of the first and second molding portions contains phosphors.

11. The method as claimed in claim 9, wherein the second molding portions are formed by using another intermediate plate having through-holes for receiving the first molding portions.

* * * * *